(12) United States Patent
Foster (10) Patent No.: US 7,305,935 B1
(45) Date of Patent: Dec. 11, 2007

(54) SLOTTED ANTENNA WAVEGUIDE PLASMA SOURCE

(75) Inventor: John Foster, Strongsville, OH (US)

(73) Assignee: The United States of America as represented by the Administration of NASA, Washington, DC (US)

( * ) Notice: Subject to any disclaimer, the term of this patent is extended or adjusted under 35 U.S.C. 154(b) by 0 days.

(21) Appl. No.: 10/925,499

(22) Filed: Aug. 25, 2004

(51) Int. Cl.
C23C 16/00 (2006.01)
C23F 1/00 (2006.01)
H01L 21/306 (2006.01)

(52) U.S. Cl. ............... 118/723 MA; 118/723 MW; 156/345.41; 156/345.42

(58) Field of Classification Search ....... 118/723 MW, 118/723 MA, 723 MR; 156/345.36, 345.41, 156/345.42, 345.46, 345.49
See application file for complete search history.

(56) References Cited

U.S. PATENT DOCUMENTS

| | | | | |
|---|---|---|---|---|
| 3,604,012 A | * | 9/1971 | Lindley | 343/768 |
| 5,466,295 A | * | 11/1995 | Getty | 118/723 MA |
| 5,579,019 A | * | 11/1996 | Uematsu et al. | 343/771 |
| 5,783,102 A | * | 7/1998 | Keller | 216/68 |
| 5,891,252 A | | 4/1999 | Yokogawa et al. | |
| 6,033,481 A | | 3/2000 | Yokogawa et al. | |
| 6,190,496 B1 | | 2/2001 | DeOrnellas et al. | |
| 6,196,155 B1 | * | 3/2001 | Setoyama et al. | 156/345.42 |
| 6,294,862 B1 | * | 9/2001 | Brailove et al. | 313/363.1 |
| 6,350,347 B1 | | 2/2002 | Ishii et al. | |
| 6,376,796 B2 | | 4/2002 | Sato et al. | |
| 6,380,684 B1 | | 4/2002 | Li et al. | |
| 6,390,019 B1 | | 5/2002 | Grimbergen et al. | |
| 6,504,159 B1 | | 1/2003 | Keller | |
| 6,551,445 B1 | | 4/2003 | Yokogawa et al. | |
| 6,632,324 B2 | | 10/2003 | Chan | |
| 2001/0008171 A1 | | 7/2001 | Fukuda et al. | |
| 2003/0062129 A1 | * | 4/2003 | Ni | 156/345.42 |
| 2003/0150562 A1 | | 8/2003 | Quon | |
| 2004/0090290 A1 | * | 5/2004 | Teshirogi et al. | 333/237 |

OTHER PUBLICATIONS

Foster "Discharge Characterization of 40 cm-Microwave ECR Ion Source and Neutralizer" NASA Gleen Research Center, Cleveland, OH, no date available.

* cited by examiner

Primary Examiner—Parviz Hassanzadeh
Assistant Examiner—Rakesh K. Dhingra
(74) Attorney, Agent, or Firm—Howard M Cohn

(57) ABSTRACT

A high density plasma generated by microwave injection using a windowless electrodeless rectangular slotted antenna waveguide plasma source has been demonstrated. Plasma probe measurements indicate that the source could be applicable for low power ion thruster applications, ion implantation, and related applications. This slotted antenna plasma source invention operates on the principle of electron cyclotron resonance (ECR). It employs no window and it is completely electrodeless and therefore its operation lifetime is long, being limited only by either the microwave generator itself or charged particle extraction grids if used. The high density plasma source can also be used to extract an electron beam that can be used as a plasma cathode neutralizer for ion source beam neutralization applications.

5 Claims, 5 Drawing Sheets

SLOTTED ANTENNA WAVEGUIDE PLASMA SOURCE

STATEMENT REGARDING FEDERALLY SPONSORED RESEARCH OR DEVELOPMENT

The invention described herein was made by an employee of the United States Government and may be manufactured and used by or for the Government for Government purposes without the payment of any royalties thereon or therefore.

FIELD OF THE INVENTION

The present invention relates to a plasma producing microwave antennas used for producing plasmas for use in ion thrusters, ion etching of surfaces, the embedding of ions within surfaces, production of electrons, and the like.

BACKGROUND OF THE INVENTION

Plasmas consist of gaseous complexes in which atoms or molecules are dissociated into free electrons, ions, free radicals, and neutral particles; stars, for instance, consist predominantly of plasmas. On earth, plasma occurs naturally in lightning bolts, flames, and similar phenomena, or may be manufactured by heating a gas to high temperatures, or by applying a strong electric field to a gas. Plasmas are called the "fourth state of matter" because their physical properties make them physically distinct from solids, liquids, and gases.

Ions, as well as electrons, from various kinds of plasma generators can be used in such industrial processes as etching, ashing (as with photoresist material or surfaces being chemically machined), deposition of materials such as oxides or nitrides, oxidation, sputtering, polymerization, ion implantation within surfaces and in high-specific-impulse thrusters for use on satellites and other space vehicles.

Drawbacks of existing direct current (DC) ion sources include erosion, short service life of plasma generators, and plasma non-uniformity. Erosion derives from the impacting of high-speed ions on the surfaces of the machines that produce plasmas. For example, DC ion sources eject erosion products into the discharge plasma as a consequence of the fact that the discharge cathode is constantly being bombarded by the ions of the plasma in which it is immersed. This is an undesirable attribute from the standpoint of materials processing, as contamination of the work product can result. DC ion sources (and DC electron sources) have limited lifetimes due to being constantly subjected to erosion, and the cathodes that drive such plasma sources typically, over time, lose their ability to emit electrons so that eventually the cathodes fail. Typically, DC ion sources (ion thrusters in particular) utilize a single on axis discharge cathode. This arrangement gives rise to peaked, non-uniform plasma density profiles at the exit plane. Such non-uniform profiles give rise to non-uniform wear of the ion extraction grids—thereby leading to failure by structural degradation or by electron backstreaming.

Disk shaped multi-slotted antenna designs have been used in the past to circumvent issues described above. These sources require, however, an insulating window for operation, i.e., for impedance matching and shielding. The insulating window, typically boron nitride makes such devices impractical for ion sources or ion thruster applications because the insulating window will acquire a coating over time due to wear of the extraction grids. The coating will ultimately prevent microwaves form penetrating the source and thus plasma production will cease.

Prior art U.S. patents include U.S. Pat. No. 6,376,796 issued to Sato, et al entitled "Plasma processing system"; U.S. Pat. No. 6,190,496 issued to DeOrnellas, et al entitled "Plasma etch reactor and method for emerging films"; U.S. Pat. No. 6,033,481 issued to Yokogawa et al entitled "Plasma processing"; and U.S. Pat. No. 5,891,252 issued to Yokogawa et al entitled "Plasma processing apparatus."

Sato, et al., U.S. Pat. No. 6,376,796 relates to a plasma processing system utilizing an antenna supplying high power generating high density plasma for performing processing on the surface of a substrate. A slotted antenna supplies high frequency power. Sato has a disk-shaped conductor that performs impedance matching. A magnetic circuit using permanent magnets is provided close to the electromagnetic wave emitter.

DeOrnellas U.S. Pat. No. 6,190,496 claims a plasma etch reactor with a reactor chamber, two electrodes and power sources connected to the electrodes generate power at two different frequencies. A third electrode generates power at a low frequency. Magnetic confinement is utilized with the reactor chamber. The reactor is useful in etching the new class of films used in chip designs. The magnets can be permanent or electromagnets and are designed to concentrate the plasma which can reduce erosion to the electrodes and also protect the process chamber parts.

Yokogawa U.S. Pat. No. 6,033,481 discusses generation of uniform plasma over a large range for use in etching processing. High density plasma is generated in a vacuum vessel housing an electron cyclotron resonance device. An electromagnetic wave is radiated from a planar conductive plate arranged opposite to the surface of the sample being processed inside the vacuum vessel. The same patent also claims an electromagnetic wave radiation antenna consisting of strip-lines provided on an earth electrode opposite the processed sample.

Yokogawa U.S. Pat. No. 5,891,252 is similar to U.S. Pat. No. 6,033,481 and is cited because it too discusses antennas with a plasma source. The earlier patent provides a plasma processing apparatus which does not require large power consumption. It also discusses supplying an electromagnetic wave from a power source to a conductive plate in a planar shape and radiating the electromagnetic wave for forming plasma from the conductive plate.

The above-cited references do not disclose the particular combination of innovative features of present invention described hereinbelow. In Sato, et al., the design of the plasma generation antenna is the main part of the invention.

ASPECTS OF THE INVENTION

It is an aspect of the present invention to provide methods and apparatus as defined in one or more of the appended claims and, as such, having the capability of accomplishing one or more of the following subsidiary aspects.

In accordance with the foregoing, one aspect of the present electrodeless slotted antenna rectangular waveguide plasma source invention is to provide a plasma source that produces a distributed, uniform plasma density profile such as to make the plasma applicable for plasma processing applications.

Another aspect is to provide a plasma source that can be operated with permanent magnets only.

Another aspect of the present invention is to provide a plasma source that is capable of operating at low flow rates and low background pressures.

Another aspect of the present invention is to provide a plasma source that can be used as either an electron or an ion source.

Another aspect of the present invention is to provide a plasma source in which the plasma current densities produced at the exit plane of the device are large so as to yield high etch rates or material deposition rates.

Yet another aspect of the present invention is to provide a plasma source that does not require a microwave window.

And a final aspect of the present invention is to provide a microwave antenna approach that is straightforward to scale up to larger areas and higher powers.

SUMMARY OF THE INVENTION

The present invention is a slotted antenna waveguide plasma source that uses microwaves to drive electron cyclotron resonance (ECR) so as to create a plasma. The slotted antenna waveguide source is comprised of a waveguide having a primary axis; parallel mounted, spaced-apart bar magnets disposed along one outer wall of the waveguide; a series of matched radiating slot pairs machined in one wall of the waveguide between the externally mounted, parallel, spaced-apart, magnets; and a discharge chamber equipped with a first plasma containment ring of magnets disposed around a central perimeter of the discharge chamber and a second plasma containment/secondary ECR production ring of magnets disposed around a far perimeter of the discharge chamber. The parallel mounted, spaced-apart magnets are permanent magnets, and their magnetic poles are oriented in the same direction. All magnets are permanent magnets. The parallel, spaced-apart magnets comprise three magnets. The slots comprising the series of matched radiating slot pairs are arranged in two mutually parallel linear rows of uniformly spaced slots, each row being parallel to the primary axis or the waveguide. Each slot of each slot pair is offset from its mate in a direction parallel to the major axis of the waveguide. The uniformly spaced slots are spaced according to wavelength of microwaves being used. And each of the slots comprising the series of matched radiating slot pairs has rounded ends.

The present invention is a slotted antenna waveguide plasma source that uses microwaves to drive electron cyclotron resonance (ECR) so as to create a plasma. The slotted antenna waveguide source is comprised of a waveguide having a primary axis; parallel, spaced-apart bar magnets disposed along one outer wall of the waveguide; a single row of radiating slots machined in one wall of the waveguide between the externally mounted, parallel, spaced-apart, magnets; and a discharge chamber equipped with a first plasma containment ring of magnets disposed around a central perimeter of the discharge chamber and a second plasma containment/secondary ECR production ring of magnets disposed around a far perimeter of the discharge chamber.

The present invention is a method for producing a plasma by means of electron cyclotron resonance (ECR), the method being characterized by the steps of acquiring a microwave waveguide, determining its primary axis of the microwave waveguide and then modifying the microwave waveguide by machining a series of matched radiating slot pairs in one wall of the waveguide at regular intervals in a direction parallel to the primary axis of the waveguide; mounting parallel, spaced-apart magnets on one external wall of the waveguide in parallel alignment with the waveguide's primary axis; and mating to the waveguide a discharge chamber having an open side away from the waveguide, and then distributing a first plasma containment ring of magnets around a central perimeter of the discharge chamber, and distributing a second plasma containment/secondary ECR production ring of magnets around a far perimeter of the discharge chamber followed by situating the mated waveguide and discharge chamber inside of an evacuated enclosure, supplying a material to be ionized into a plasma into the enclosure and finally radiating microwaves into an opening at one end of the waveguide. The waveguide's physical dimensions and characteristics are matched with microwave wavelength to be used. The poles of the parallel, spaced apart magnets are oriented in the same direction, and all the magnets are permanent magnets. Each slot within each matched radiating slot pair is offset from one another in a direction parallel to the major axis of the waveguide. The slots are all machined so as to have rounded ends.

BRIEF DESCRIPTIONS OF THE FIGURES

The structure, operation, and advantages of the present invention will become apparent upon consideration of the description hereinbelow taken in conjunction with the accompanying FIGURES. The figures are intended to be illustrative, not limiting. Certain elements in some of the FIGURES may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity.

Although the invention is generally described in the context of these preferred embodiments, it should be understood that the FIGURES are not intended to limit the spirit and scope of the invention to these particular embodiments.

Certain elements in selected ones of the FIGURES may be illustrated not-to-scale, for illustrative clarity. The cross-sectional views, if any, presented herein may be in the form of "slices", or "near-sighted" cross-sectional views, omitting certain background lines which would otherwise be visible in a true cross-sectional view, for illustrative clarity.

Elements of the FIGURES can be numbered such that similar (including identical) elements may be referred to with similar numbers in a single FIGURE. For example, each of a plurality of elements collectively referred to as 199 may be referred to individually as 199a, 199b, 199c, etc. Or, related but modified elements may have the same number but are distinguished by primes. For example, 109, 109', and 109" are three different elements which are similar or related in some way, but have significant modifications, e.g., a tire 109 having a static imbalance versus a different tire 109' of the same design, but having a couple imbalance. Such relationships, if any, between similar elements in the same or different figures will become apparent throughout the specification, including, if applicable, in the claims and abstract.

The structure, operation, and advantages of the present preferred embodiment of the invention will become further apparent upon consideration of the following description taken in conjunction with the accompanying FIGURES, wherein.

DEFINITIONS

Substrate refers to a material or workpiece that is to be etched by exposure to a plasma.

Contactor refers to a virtual "grounding rod" which serves to control charge buildup by generating a conductive plasma bridge so that excess charge can be discharged to the ambient potential.

DETAILED DESCRIPTION OF PREFERRED EMBODIMENT

Electrodeless electron cyclotron resonance (ECR) is the means employed in this slotted antenna waveguide plasma source invention. ECR is a commercially used technology primarily in the fields of high energy research and, at lower power, semiconductor wafer processing equipment for etching and material deposition.

This present invention has two factors that make it superior to any commercial ECR systems on the market.

It is electrodeless, and permanent magnets are used to generate the plasma as opposed to present-day commercial systems that use electromagnets and electrodes that are consumable. In wafer processing the electrode slowly erodes and results in some level of contamination on the wafer surface. Contaminated wafer areas are waste, thereby reducing processing throughput, efficiency, and yield. The technology eliminates the electrode and the subsequent contamination resulting in improved processing.

The configuration of the magnets above the slotted grid allows maintenance of a relatively constant power/slot ratio. Long bar-like spaced-apart parallel magnets above the slots create a series of channels. When a higher power design is required, slots are added to the grid in the channels and the input power can be increased. A full scale prototype has been operated with performance verified.

The purpose of this slotted antenna source invention is to electrodelessly generate uniform discharge plasma at reduced input powers and gas flow rates. This slotted antenna plasma source invention provides a source of ions as well as electrons in a completely electrodeless manner using ECR. It features a series of matched radiating slot pairs that are distributed at regular intervals along the length of the waveguide portion of this plasma source. This arrangement allows the plasma production to take place in a distributed fashion thereby giving rise to a uniform plasma profile. A uniform plasma profile is necessary for ion (electron) extraction optics uniformity. The slotted antenna design makes the approach scalable to much high powers. All that is required is the adding of additional matched radiating slot pairs along the length of the discharge chamber. In order for the power/slot ratio to remain constant, input microwave power must increase accordingly. Another key attribute of the slotted antenna approach described here is that it is designed so that an insulating window is not necessary. This allows the slotted antenna source to be used for ion beam and electron beam applications. The source is designed so that ECR takes place above each slot and the magnetic field at each slot provides a strong gradient to prevent plasmas backflow. The windowless nature of this invention gives it a distinct advantage over other slotted plasma source geometries which can only be used in non ion beam, non-deposition type plasma applications.

This invention produces high current densities and uniform discharge plasma. Additionally, it does not require cumbersome, energy-hungry electromagnets. The source has operated at 2.45 GHz but can be designed to operate at virtually any microwave frequency (915 MHZ to 6 GHz is a typical practical range of operation). Also, it does not require a microwave window which would otherwise be a contamination source. For ion beam applications this window could also be coated thereby preventing microwaves from coupling into the source and producing a discharge plasma.

The present electrodeless slotted antenna plasma source invention provides a uniform plasma density profile. Being an electrodeless plasma source, it has a long service life. It operates on the principle of electron cyclotron resonance (ECR). It does not require an insulating window, allowing it to be used for ion beam and electron beam applications. Thus this slotted antenna plasma source invention produces high current densities and uniform discharge plasma. This electrodeless slotted antenna plasma source invention can operate at virtually any microwave frequency, a typical range being 915 MHz to 6 Ghz. It has the potential to be used for ion thruster applications on spacecraft, including satellites, or as a source for plasmas appropriate for use in materials processing. Moreover it does not require electromagnets, as it operates with permanent magnets.

The primary advantage of this invention is the use of a slotted waveguide and a rectangular discharge that permits direct scalability to larger areas and higher power generators. As a source of ions or electrons, it can be scaled up simply by adding slots to the waveguide antenna. It is somewhat analogous to the slotted antennas used in microwave communication technologies.

Figure 1A:
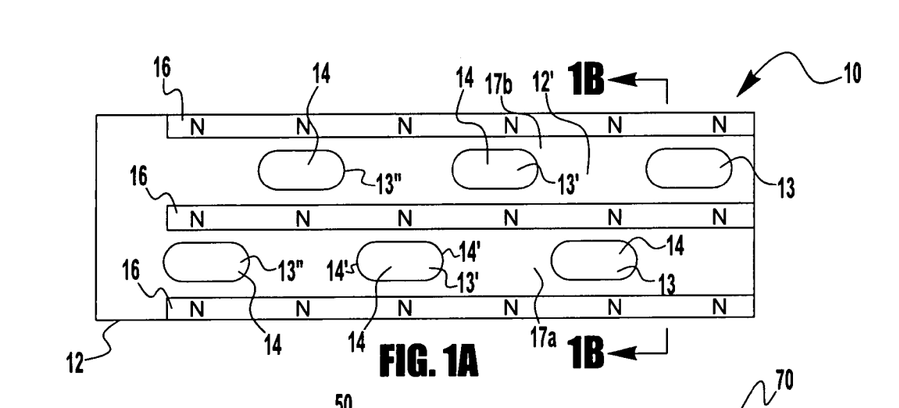
FIG. 1A is an orthogonal schematic top view of the present electrodeless slotted waveguide plasma source invention showing the slotted waveguide and magnets.
Figure 1B:
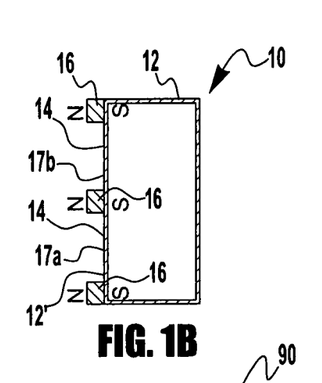
FIG. 1B is an orthogonal schematic end view of the present electrodeless slotted waveguide plasma source invention showing the slotted waveguide and magnets.
Figure 2:
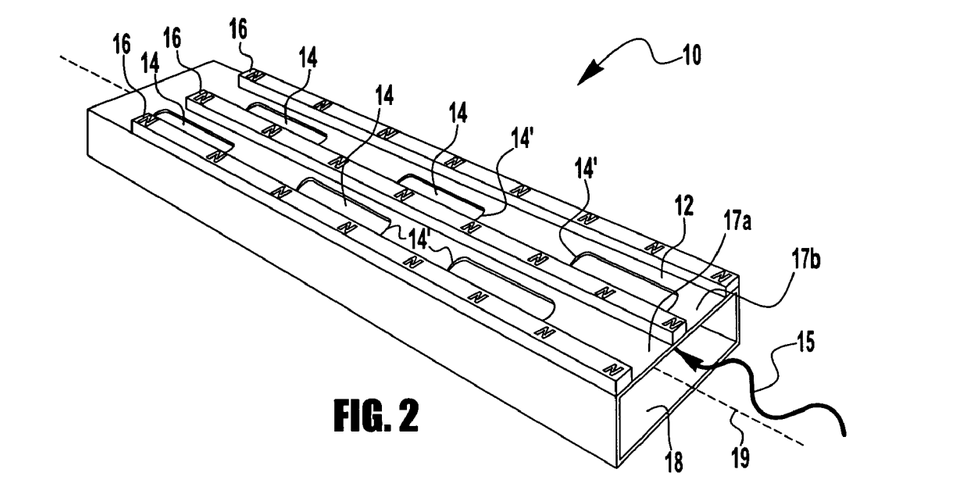
FIG. 2 is an oblique schematic view of the present electrodeless slotted waveguide plasma source invention, showing the slotted waveguide, magnets and the inlet for microwave power.

Referring now to FIGS. 1A, 1B and 2, the basic structure of the present invention becomes evident. FIG. 1A is an orthogonal view of the top side (i.e., the long slotted side) of the present invention 10 comprised of the waveguide body 12, slots 14, and parallel, spaced-apart bar magnets 16 mounted along the external surface of one outer wall 12' of the waveguide 12. FIG. 1B shows the slotted waveguide invention 10 in cross-sectional view A-A' as that view is indicated in FIG. 1A. FIG. 2 is an oblique view of the waveguide invention 10, showing the waveguide 12, the slots 14, and the permanent magnets 16. The slots 14 comprise a series of matched radiating slot pairs (designated as 13, 13', and 13", these numbers designating mated pairs of slots) machined in one wall 12' of the waveguide 12. The slots 14 and the slot pairs 13,13' and 13" can also be regarded as being arranged in two mutually parallel linear rows of uniformly spaced slots located within channels 17a, 17b lying between the parallel mounted, spaced-apart bar magnets 16, each row being parallel to the primary axis of the waveguide.

Referring now specifically to FIG. 2, there is shown the waveguide 12 having a primary axis 19 and with the slots 14 comprising a series matched radiating slot pairs disposed in two rows within channels 17a and 17b, and three bar magnets 16 disposed such as to separate and bracket each row or line of slots. The primary axis 19 is the long, or main, axis of the waveguide. Microwaves 15 are fed into the waveguide 12 at the open end 18 of the waveguide. The three magnets 16 are arranged such that their magnet poles are oriented in the same direction, shown with north pole face oriented upward in FIG. 2. This is a preferred configuration, all polarities of the magnets 16 being the same, either N or S. However, the antenna has also been operated with alternating lines of magnets as well.

Three permanent magnets 16 is the maximum number envisioned. In this case the slots 14 are bounded by lines of magnets 16 on either side. This configuration has been validated. It is possible to use only two magnet row 16 as well. This too has been validated, especially at the higher frequencies where the spacing between slots 14 is too small to place a magnet of adequate field strength between slots. Additionally, it has been found that this configuration tends to reduce the magnetic field between slots 14 thereby allowing case of diffusion of plasma from the slotted antenna region into the plasma volume. Again, this approach has found best utility at the higher frequencies where the required field strengths are large and can thus reduce diffusion of plasma from the ECR zone.

The purpose of the lines of permanent magnets 16 is to establish the necessary magnetic field in the region above the slot (i.e., outside of the waveguide 12) to ensure ECR. The magnets 16 also generate a field profile that prevents the backflow of plasma in the slot 14. In this respect, at least two and no more than three magnet rows are used.

It is possible to utilize a single row of slots 14, in which case only two permanent bar magnets 16 would be needed or required. The main requirement is that the slots 14 radiate in phase. In this regard, at most only two rows 17a,17b of alternating slots 14 can be utilized.

It is worth noting that the slots may not necessarily be uniformly spaced perpendicular to the waveguide centerline, but they must be uniformly spaced along the axis.

During operation of this slotted antenna invention, plasma forms in the region of the desired electron cyclotron resonance (ECR) takes place on magnetic contours of sufficient magnetic field strength that satisfies the conditions for ECR. I.e., plasma production takes place at locations (plasma production sites) that are volumes of space disposed just outside of the waveguide 12 around the edges and centered on the middle of each slot 14. During normal operation, the separate plasma productions sites associated with each slot 14 coalesce to become a single lines of plasma production that fill the channels 17a and 17b. That is to say, the series of matched radiating slot pairs are located below the plasma production regions or sites which are more or less ellipsoidal until they coalesce or merge into single long strips of plasma filling, respectively, the channels 17a, 17b.

The slots 14 are not rectangular, rather each of the slots 14 comprising the series of matched radiating slot pairs (shown as 13, 13' and 13" in FIG. 1A) has rounded ends, i.e., the short sides 14' (FIG. 1A) of each rectangular slot is rounded. The dimensions of the slots are to be understood by referring to FIG. 3. The length SL of each slot 14 is ½ the wavelength of the microwaves entering the end 18 of the waveguide 12. The distance D between the slots 14 is ½ the waveguide wavelength. The distance D between the uniformly spaced slots 14 within each row or channel 17a,17b can be longer than D so as long as the radiation field is in phase. That is, the slots 14 are spaced according to the wavelength of the microwaves to be used. The width W of the slot is chosen to be sufficiently narrow such that the aperture radiates like an idealized slot but not so narrow that the electric field causes electrical breakdown (arcing).

Figure 3:
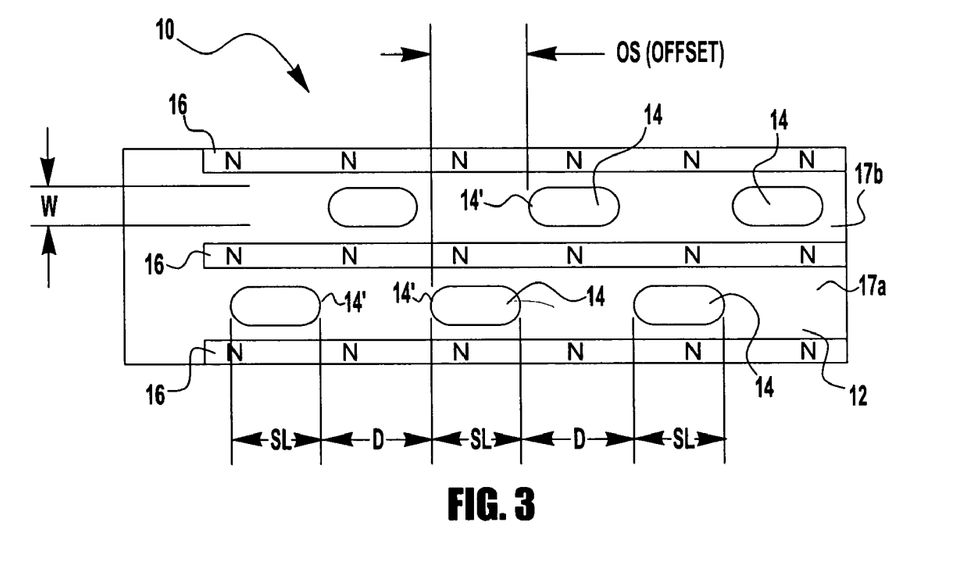
FIG. 3 is an orthogonal schematic view top view of the present slotted waveguide plasma source invention, showing the characteristic dimensions and spacing of the slots.

Note in FIGS. 1A, 2, and 3 that the two lines of slots 14 filling the channels 17a and 17b between the magnets 16 are offset from one another by an amount shown as OS in FIG. 3. That is, each slot of each slot pair is offset by an amount OS from its mate in a direction parallel to the major axis of the waveguide. The optimal offset OS of the slots sets in the respective channels 17a and 17b is determined either computationally or empirically. The offset OS works to intersect or interrupt the current in the wall of the waveguide 12. In general, the displacement depends on the number of slots. If there is a large number of slot pairs, and uniform power distribution per slot is desired, then the slot displacements will not be uniform. Also, the invention does not have to have 3 slot pairs as shown in the FIGURES. More slots can be added in scaling up the power. In addition to the slot pairs, there must be one drainage slot which "empties" the remaining power.

Waveguide sizes are standardized such that the waveguide's characteristics are matched with the wavelength of microwave radiation to be used. The waveguide 12 used with this invention is WR 159 for 5.85 GHz operation, or WR 340 for 2.45 GHz operation. For each size, there is a specific frequency range over which the waveguide will operate.

Figure 4:
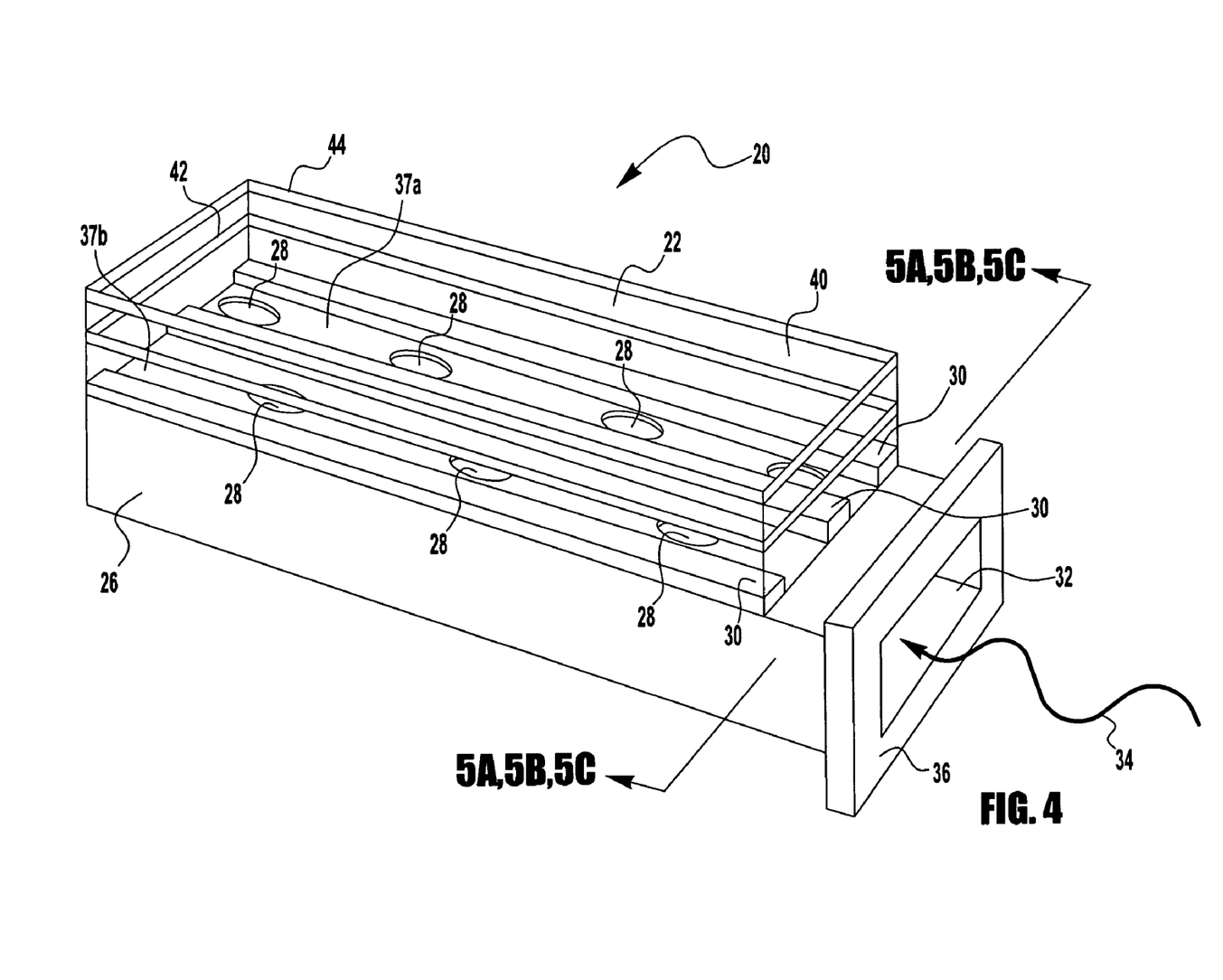
FIG. 4 is an oblique schematic view of the present slotted waveguide plasma source invention, showing the slotted waveguide, magnets, inlet for microwave power, and a plasma containment/secondary ECR production ring.

FIG. 4 is an oblique view of the slotted antenna plasma source invention 20 with a discharge chamber 22 mated to the slotted waveguide 26 which has slots 28 disposed between spaced apart magnets 30. ECR takes place near the plane 40 defining the top of (as shown in the view of FIG. 4; the plane of the "top" is marked as a dashed line 57 in the inverted view of FIG. 5A) the channels 37a,37b. Microwaves 34 enter the waveguide 26 through the opening 32 in the waveguide mounting flange 36 which connects to a microwave source (not shown). The rectangular discharge chamber 22 is open at its top 40 and has disposed around its central perimeter (defined as the region of the discharge chamber about midway between the slotted wall of the waveguide 26 and the top plane 40 of the discharge chamber) a first plasma containment ring of permanent magnets 42. The discharge chamber 22 also has a second plasma containment/secondary ECR production ring of magnets 44 disposed around its far perimeter (which lies in the plane 40 and is the portion of the discharge chamber most distal from the slotted wall of the waveguide 26). (The plane of the top [i.e., 40 in FIG. 4] is visible as a dashed line 57 in the inverted, end-on, schematic view of FIG. 5A.) The circumferentially disposed plasma containment ring of magnets 42 reduces diffusion losses and enhances the utilization of the hot electrons produced near the ECR zones defined by the channels 37a, 37b that are more or less in the region between the magnets 30. ECR can also take place at these rings, providing additional ionization at the periphery.

Figure 5A:
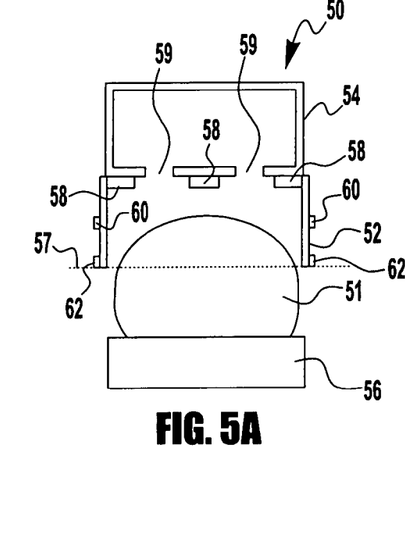
FIG. 5A is a schematic end-view of the electrodeless slotted waveguide plasma source invention showing the arrangement of the major components for plasma processing of materials.
Figure 5B:
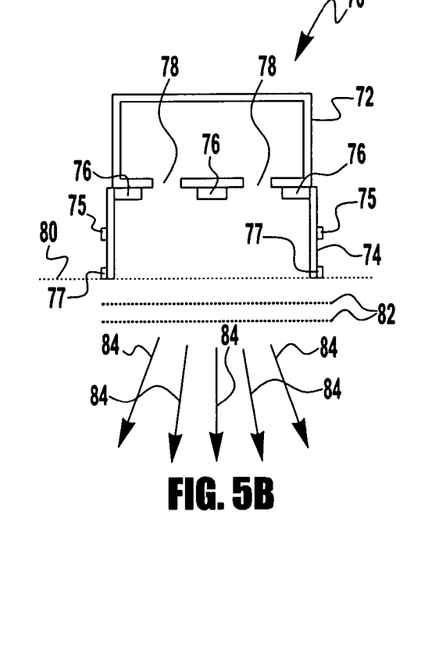
FIG. 5B is a schematic end-view of the electrodeless slotted waveguide plasma source invention showing the arrangement of the major components for use of the invention in the production of ions for use in an ion thruster application.
Figure 5C:
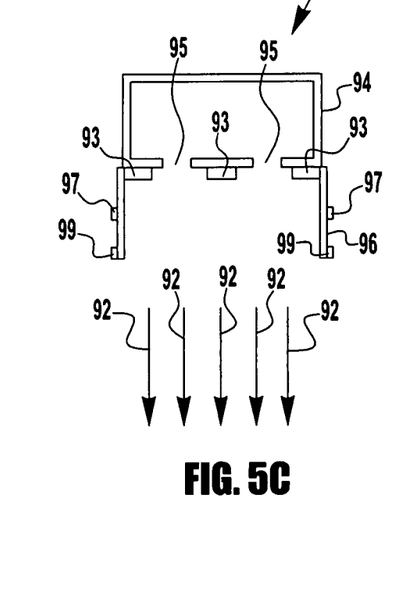
FIG. 5C is a schematic end-view of the slotted waveguide plasma source invention showing the arrangement of the major components when the invention is used as an electron source.

FIGS. 5A, 5B and 5C are end-on, inverted, sectional views (direction of view as indicated in FIG. 4) of the waveguide plasma source shown as 20 of FIG. 4.

FIG. 5A is a schematic view of the present slotted antenna plasma source invention 50 as it would be used in the plasma processing of a material or substrate 56. FIG. 5A shows waveguide 54 mated with discharge chamber 52 disposed above a material or substrate 56 disposed near the plane 57 of the outlet of the discharge chamber. A volume of plasma 51 is shown abutting (and acting upon) a substrate 56. That is to say, FIG. 5A shows the approximate location of a substrate 56 relative to the waveguide 54 and the discharge chamber 52 when the present invention is used in the plasma processing of materials. FIG. 5A also shows the spaced-apart parallel magnets 58, slots 59, a first plasma containment ring of magnets 60 and a second plasma containment/secondary ECR production ring of magnets 62.

FIG. 5B is a view of the slotted antenna plasma source invention 70 as it would appear (schematically) when used as an ion source intended for use as a thruster or ion milling/ion implantation. FIG. 5B shows the waveguide 72, discharge chamber 74, spaced-apart parallel magnets 76, slots 78, a first plasma containment ring of magnets 75 and a second plasma containment/secondary ECR production ring of magnets 77. The plane of the "top" or outlet 80 of the discharge chamber 74 is denoted by a dashed line, beyond which (i.e., outside of the discharge chamber) are disposed electrically charged grids 82 of the sort typically used to accelerate ions from the plasma source 70 in the direction indicated by arrows 84.

FIG. 5C is a view of the slotted antenna plasma source invention 90 as it would appear (schematically) when used to produce an electron beam 92. FIG. 5C shows waveguide 94, discharge chamber 96, spaced-apart parallel magnets 93, slots 95, first plasma containment ring of magnets 97 and a second plasma containment/secondary ECR production ring of magnets 99. Electrons emerge from the discharge chamber 96 in the direction indicated by the arrows 92. The electrons, having much less mass than the corresponding ions of the plasma, emerge from the discharge chamber 96 at much higher speeds than do the heavier ions.

When the present invention is used in the applications described above in relation to the FIGS. 5A, 5B and 5C, mated waveguide and discharge chamber assembly is disposed such that the microwaves from the waveguide radiate into an evacuated enclosure into which a material to be ionized by radiating microwaves into a plasma is injected.

Window

A window, made of a dielectric material through which microwaves are emitted prior to producing plasmas, is used in some microwave plasma sources. No window is needed, used, or required in the present invention. And example of the use of such a dielectric window is taught in U.S. Pat. No. 6,376,796, to Sato, et al., who describe a disk-shaped multi-slotted antenna design.

In general, the function of the dielectric window is to aide in impedance matching of the microwaves from the waveguide to the vacuum. Additionally, the dielectric window can serve as a physical barrier to backflowing plasma which could potentially give rise to breakdowns and arcing that would disrupt microwave flow. In the present slotted antenna plasma source invention, the magnetic circuit in the near the waveguide slots allows for gas breakdown and well-matched plasma production downstream of the slots. The well-matched plasma produced as a consequence of the optimized magnetic circuit eliminates the need for dielectrics to aid in impedance matching. Additionally, the magnetic field profile at each slot prevents plasma from backflowing into the slots and causing breakdowns there. Additionally, the magnetic field at and inside the slots is not sufficient to produce ECR so no plasma production can take place in the waveguide. Finally, the use of multiple slots reduces the electric field at each slot and thereby minimizes slot arcing which could be caused by the presence of the plasma. This is how the dielectric window was eliminated.

The invention of Sato, et al., utilizes a dielectric window that is described in the second paragraph, column 7, of the patent. The window covers the antenna disk comprising a hypothetical plane from which the microwaves emerge from the dielectric disk (20). In contrast, and as noted supra, the slotted antenna source according to the present invention does not utilize a microwave window of any kind. The microwave excitation emerges from the slots in the waveguide itself. No dielectric is required for microwave transport or matching. It should be pointed out that the device in Sato's invention is subject to coatings which could extinguish the discharge if they are conductive. That is to say, the present waveguide plasma source invention is designed so that no microwave dielectric window is not needed, and since there is no window, the issue of window coatings is thereby eliminated. Window coatings can prevent microwave flow (if the coating is metallic) or effect matching (if the coating is dielectric). The present windowless slotted antenna design can be used to generate plasma for materials processing applications where there are condensable dielectric or metal vapors present, because there is no dielectric window to coat over or otherwise fail. The dense plasma generated by this approach can be used for ion or electron extraction. In this respect it can serve as either an ion or an electron source.

Performance

Figure 6A:
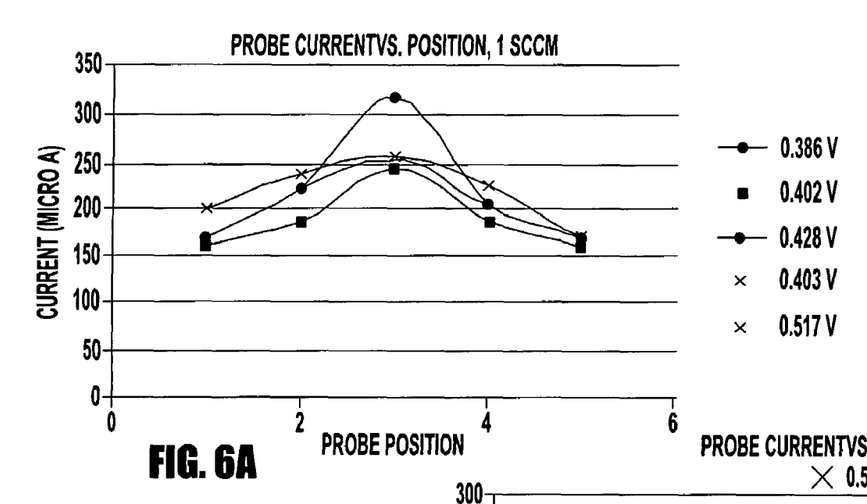
FIGS. 6A and 6B are graphs of ion current density profiles.
Figure 6B:
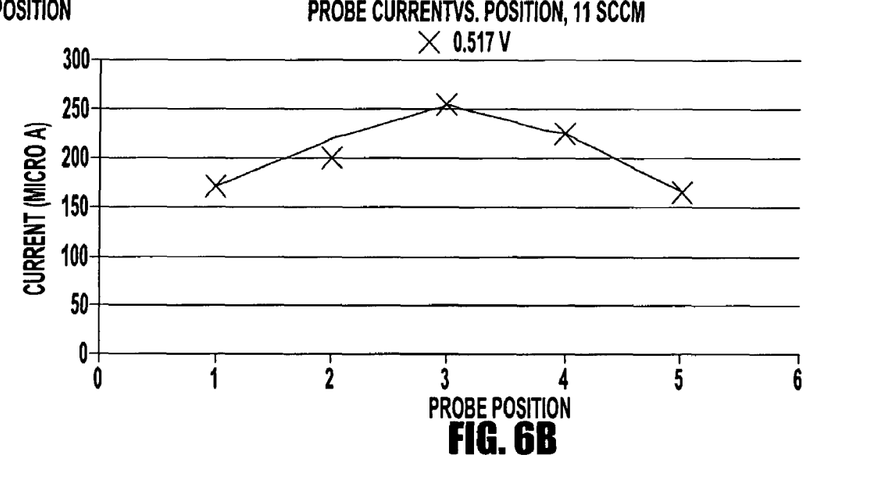
Figure 7A:
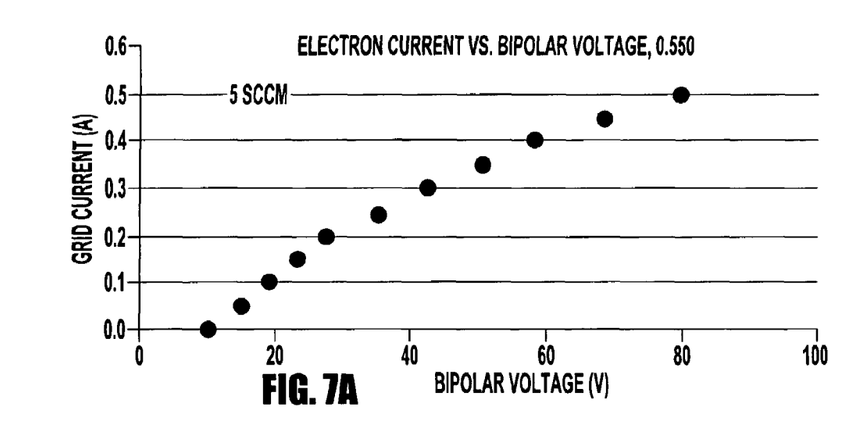
FIGS. 7A and 7B illustrate grid voltage as a function of extractable electron current at different flow rates when the invention is used as an electron source.
Figure 7B:
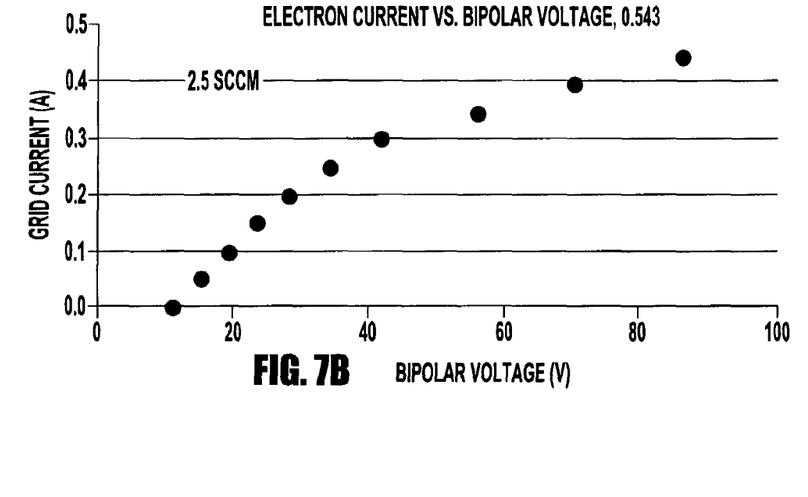

FIGS. 6A and 6B show graphs of ion current density profiles as a function of position down the length of the rectangular plasma source at low and high flow rates between 48 and 74 W of microwave power. FIGS. 7A and 7B illustrate grid voltage as a function of extractable electron current at different flow rates when the slotted antenna plasma source invention is used as an electron source.

General Comments

This invention as applications in the semiconductor manufacturing sector as well as the broader area of plasma processing. Because of the unique ease of scaling to larger areas, work piece size is not a factor. The large uniform plasma produced by the above described source makes ideal for the processing of silicon wafers, implanting ions in various materials or controlling the chemistry of a deposition plasma. The scalable rectangular discharge shape is easily adaptable to commercial processes in semiconductor manufacturing and larger scale ion deposition processes that are currently limited to comparatively small work pieces. Erosion products are virtually eliminated as the plasma production is a purely electrodeless process. Manufacturers of semiconductor products either develop or utilize plasma sources for silicon wafer processing, implantation, or deposition processing.

This plasma source invention could also be used for long life ion thruster applications on commercial satellites. Additionally, satellite manufacturers may be interested in the source for satellite charge control. The slotted antenna source could also serve as a plasma contactor for such applications. Also, since no windows are used or required, the device can operate in environments of condensable metal vapors.

Although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

What is claimed is:

1. A windowless slotted antenna waveguide plasma source that uses microwaves to drive electron cyclotron resonance (ECR) so as to create a plasma, the windowless slotted antenna waveguide source being comprised of:
    a slotted waveguide having a longitudinal primary axis and an open end adapted to receive the microwaves;
    first, second and third parallel, spaced-apart permanent bar magnets each having a longitudinal axis mounted on an external surface of one wall of the slotted waveguide and the longitudinal axis of each of the bar magnets being parallel to the longitudinal primary axis to create first and second channels;
    at least three matched radiating slot pairs in the one wall of the waveguide disposed with one slot of each of the at least three matched slot pairs disposed in the first channel between the first and second externally mounted, parallel, spaced-apart permanent bar magnets and the other slot of each of the at least three matched slot pairs disposed in the second channel between the second and third externally mounted, parallel, spaced-apart permanent bar magnets whereby ECR takes place above each slot of the at least three matched slot pairs outside of the antenna waveguide and the magnetic field at each slot provides a strong gradient to prevent plasma backflow through each slot into the wave guide; and
    a windowless discharge chamber open to the waveguide and equipped with:
        a first plasma containment ring of permanent magnets disposed around a central perimeter of the discharge chamber; and
        a second plasma containment/secondary ECR production ring of permanent magnets disposed around a far perimeter from the antenna of the windowless discharge chamber.

2. The windowless slotted antenna waveguide plasma source of claim 1 wherein the slots in each of the first and second channels are uniformly spaced from each other.

3. The windowless slotted antenna waveguide plasma source of claim 1 wherein the slots comprising each matched radiating slot pair are disposed such that one slot of each slot pair in the first channel is offset from the other slot of each slot pair in the second channel in a direction parallel to the primary axis of the waveguide.

4. The windowless slotted antenna waveguide plasma source of claim 1 wherein the magnetic poles of the first, second and third parallel, spaced-apart permanent bar magnets are oriented in the same direction whereby the same pole of each of the first, second and third, parallel, spaced-apart permanent bar magnets is disposed against the one wall of the waveguide and the opposite pole of each of the first, second and third, parallel, spaced-apart permanent bar magnets is oriented in the same direction upward from the waveguide.

5. The slotted antenna waveguide plasma source of claim 1 wherein the slots in each of the first and second channels are spaced apart according to wavelength of microwaves being used.

* * * * *